(12) United States Patent
Anderson et al.

(10) Patent No.: US 9,153,669 B2
(45) Date of Patent: Oct. 6, 2015

(54) LOW CAPACITANCE FINFET GATE STRUCTURE

(71) Applicant: INTERNATIONAL BUSINESS MACHINES CORPORATION, Armonk, NY (US)

(72) Inventors: Brent A. Anderson, Jericho, VT (US); Andres Bryant, Burlington, VT (US); Edward J. Nowak, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/167,197

(22) Filed: Jan. 29, 2014

(65) Prior Publication Data

US 2015/0214325 A1 Jul. 30, 2015

(51) Int. Cl.
*H01L 21/28* (2006.01)
*H01L 29/66* (2006.01)
*H01L 29/78* (2006.01)

(52) U.S. Cl.
CPC ........ *H01L 29/6681* (2013.01); *H01L 29/6656* (2013.01); *H01L 29/66545* (2013.01); *H01L 29/7851* (2013.01)

(58) Field of Classification Search
CPC ............ H01L 29/66545; H01L 29/7833; H01L 29/517; H01L 21/823842; H01L 21/28114; H01L 21/28088; H01L 29/6681; H01L 29/7851; H01L 29/6656
See application file for complete search history.

(56) References Cited

U.S. PATENT DOCUMENTS

| | | | |
|---|---|---|---|
| 7,256,455 B2 | 8/2007 | Ahmed et al. | |
| 7,902,009 B2 | 3/2011 | Simonelli et al. | |
| 8,236,634 B1 | 8/2012 | Kanike et al. | |
| 8,264,048 B2 | 9/2012 | Rachmady et al. | |
| 8,466,034 B2 * | 6/2013 | Maszara et al. | 438/424 |
| 8,492,845 B2 * | 7/2013 | Anderson et al. | 257/368 |
| 2011/0183508 A1 | 7/2011 | Chan et al. | |
| 2011/0237046 A1 * | 9/2011 | Maszara et al. | 438/424 |
| 2012/0112287 A1 * | 5/2012 | Anderson et al. | 257/368 |
| 2013/0161762 A1 | 6/2013 | Kelly et al. | |

* cited by examiner

*Primary Examiner* — Nikolay Yushin

(74) *Attorney, Agent, or Firm* — Michael J. LeStrange; Roberts Mlotkowski Safran & Cole, P.C.

(57) ABSTRACT

Low capacitance finFET gate structures and methods of manufacturing. The method includes forming a layer of material on a substrate. The method further includes forming a dummy gate structure on the substrate which abuts the layer of material. The method further includes forming at least one spacer adjacent to the dummy gate structure and the layer of material. The method further includes removing the dummy gate structure and at least a portion of the layer of material to form an opening with a varying length. The method further includes forming a replacement gate structure with varying length by depositing gate material in the opening with the varying length.

18 Claims, 6 Drawing Sheets

LOW CAPACITANCE FINFET GATE STRUCTURE

FIELD OF THE INVENTION

The invention relates to semiconductor structures and, more particularly, to low capacitance finFET gate structures and methods of manufacturing.

BACKGROUND

As integrated circuits continue to scale downward in size, the finFET has become an attractive device for use with smaller nodes, e.g., the 22 nm node and beyond. In a finFET, the channel is formed by a semiconductor fin and a gate electrode is located on at least two sides of the fin. Due to the advantageous feature of full depletion in a finFET, the increased number of sides on which the gate electrode controls the channel of the finFET enhances the controllability of the channel in a finFET. The improved control of the channel allows smaller device dimensions with less short channel effects as well as larger electrical current that can be switched at high speeds. A finFET device generally has faster switching times, equivalent or higher current density, and much improved short channel control than planar CMOS technology utilizing similar critical dimensions.

Given the control of the conducting channel by the gate, which "wraps" around the channel, very little current is allowed to leak through the body when the device is in the off state. This allows the use of lower threshold voltages, which results in optimal switching speeds and power. However, the 3D nature of finFETs and the multiple fins making up the transistors introduce a large number of parasitic resistance and capacitances to be considered. For example, gate to contact capacitance degrades device performance if spacers are too thin; whereas, thick spacers degrade device performance due to increased resistance.

SUMMARY

In an aspect of the invention, a method comprises forming a layer of material on a substrate. The method further comprises forming a dummy gate structure on the substrate which abuts the layer of material. The method further comprises forming at least one spacer adjacent to the dummy gate structure and the layer of material. The method further comprises removing the dummy gate structure and at least a portion of the layer of material to form an opening with a varying length. The method further comprises forming a replacement gate structure with varying length by depositing gate material in the opening with the varying length.

In an aspect of the invention, a method comprises: forming a fin structure on a substrate; forming a dielectric material on the substrate and abutting the fin structure; forming a dummy gate structure abutting the dielectric material; forming at least one spacer adjacent to the dummy gate structure; removing the at least one dummy gate structure and at least a portion of the dielectric material in order to form an opening with a first length above a channel region and a second length adjacent to the first length; forming a replacement gate structure in the opening such that the replacement gate structure has a first dimension corresponding to the first length and a second dimension corresponding to the second length; and forming source and drain contacts adjacent to the at least one spacer. The first dimension of the replacement gate structure has a lower capacitance than the second dimension of the replacement gate structure.

In an aspect of the invention, a structure comprises a fin structure on a substrate. The structure further comprises a replacement gate structure adjacent to the fin structure which has a first length defined by a first spacer and a second length in a channel region of a device defined by a second spacer, the first length being shorter than then second length. The structure further comprises source and drain contacts adjacent to the second spacer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the low capacitance finFET, which comprises the structures of the present invention. In still further embodiments, a method in a computer-aided design system is provided for generating a functional design model of the low capacitance finFET. The method comprises generating a functional representation of the structural elements of the low capacitance finFET.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to low capacitance finFET gates and methods of manufacturing. In embodiments, the low capacitance finFET gate can be formed by using spacers of different thicknesses, prior to formation of a replacement gate structure. For example, dual or single spacers can be formed with different thicknesses created by use of a dielectric material which is removed (or recessed) during replacement gate process. In this way, a thin spacer in the channel region of the gate keeps the resistance low, e.g., forms a long gate length in the channel region; whereas, a thicker spacer outside the channel region keeps the capacitance higher, e.g., forms a shorter gate length away from the channel region. Advantageously, by implementing the processes of the present invention it is now possible to form a finFET with dual capacitance along its length.

In embodiments, the method of manufacturing the low capacitance finFET gate structure comprises providing a substrate and patterning the top silicon layer to form a fin. A first dielectric layer is deposited over the fin and a dummy gate is formed by depositing and patterning of a sacrificial gate material. One or more spacers are formed abutting sides of the dummy gate. A second dielectric is formed over the substrate abutting the one or more spacer. The first dielectric is recessed or removed in a region near the intersection of the spacer and the fin. This removal process can be used to adjust a length of the dummy gate material, in or near a channel region. The dummy gate is removed and a replacement gate is formed in its place. The replacement gate can be a metal gate process, including the deposition of high-k dielectric material abutting the spacer and the fin abutting a source and drain region. A drain contact and a source contact are formed adjacent to the replacement gate.

Figure 1A:
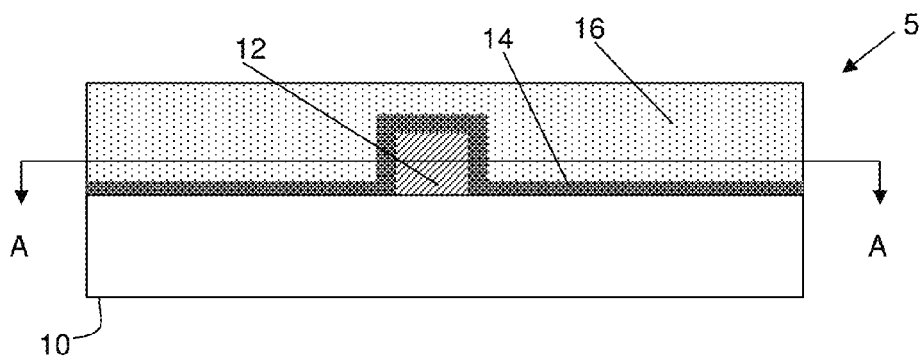
FIGS. 1*a* and 1*b* show different views of a structure and respective processing steps in accordance with aspects of the present invention.
Figure 1B:
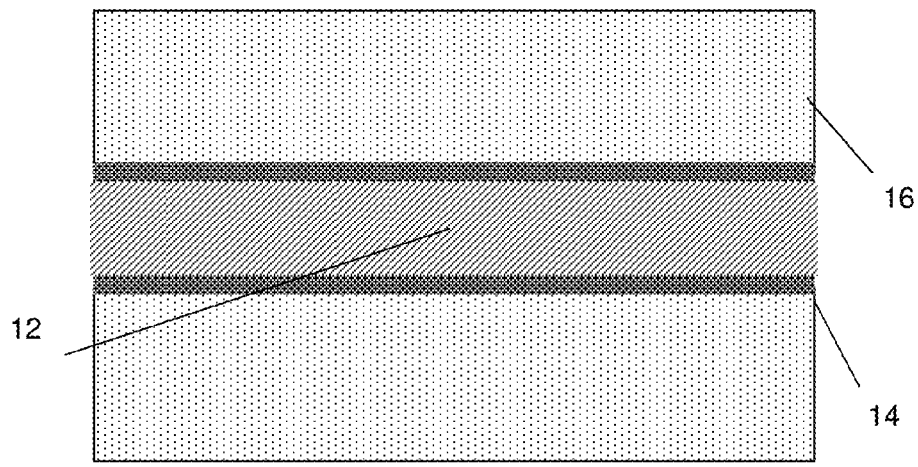

FIGS. 1a and 1b show a structure and respective processing steps in accordance with aspects of the present invention. More specifically, FIG. 1a shows a cross sectional view of a structure 5; whereas, FIG. 1b shows a top view of the structure along line A-A of FIG. 1a. It should be understood by those of skill in the art that the process of manufacturing the low-capacitance FET of the present invention and other passive and active components of the present invention can be manufactured in a number of ways using a number of different tools. In general, though, the methodologies and tools are adopted from integrated circuit (IC) technology to form the structures of the present invention with specific dimensions. For example, the structures of the present invention, e.g., low-capacitance FinFET, are built on wafers and are realized in films of materials patterned by photolithographic processes. In particular, the fabrication of the structures uses three basic building blocks: (i) deposition of films of material on a substrate, (ii) applying a patterned mask on top of the films by photolithographic imaging, and (iii) etching the films selectively to the mask.

More specifically, as shown in FIGS. 1a and 1b the structure 5 includes a substrate 10 which can be any layer of a device including an interlevel dielectric layer or wafer. As should be understood by those of skill in the art, the substrate 10 can be implemented in either an SOI wafer or BULK implementation, as examples. The constituent materials of the SOI wafer or BULK implementation may be selected based on the desired end use application of the semiconductor device. For example, the insulation layer, e.g., BOX, may be composed of oxide, such as $SiO_2$. Moreover, the active semiconductor layer can be comprised of various semiconductor materials, such as, for example, Si, SiGe, SiC, SiGeC, etc. The SOI wafer may be fabricated by conventional processes including, but not limited to, oxygen implantation (e.g., SIMOX), wafer bonding, etc.

In FIGS. 1a and 1b, one or more fins 12 are formed on the substrate 10 or, in embodiments, from the substrate 10. In embodiments, the one or more fins 12 are formed from active semiconductor material such as SiGe or Si, as examples. The fabrication processes for forming the fins 12 can be, for example, conventional deposition, lithography and etching processes, including sidewall image transfer (SIT) processes. By way of illustrative, non-limiting example, in SIT processes, a hardmask material is formed on the silicon material which, in turn, is covered by a resist. The resist is exposed to energy (light) to form a pattern (openings). An etching process, e.g., reactive ion etching (RIE), is performed through the openings to form mandrels from the hardmask material. A sidewall material is formed on the mandrels and, thereafter, the mandrels are removed by selective etching to the sidewall material. The underlying silicon material then undergoes an etching process, with the sidewall material protecting the underlying silicon material. The sidewall material is then removed, leaving the fins 12. The dimensions of the fins 12 can vary depending on the design specifications, e.g., the fins can be parallel to one another with a width of about 5 nm to 10 nm; although, other dimensions are also contemplated by the present invention.

FIGS. 1a and 1b further show the formation of a dielectric layer 14 over the one or more fins 12 (and exposed portions of the substrate 10). In embodiments, the dielectric layer 14 can be $SiO_2$ or other dielectric layers, which is selective to subsequently formed spacers. In embodiments, the dielectric layer 14 can be formed by conventional deposition methods, e.g., chemical vapor deposition (CVD), plasma vapor deposition (PVD) or atomic layer deposition (ALD), amongst others. The dimensions, e.g., thickness, of the dielectric layer 14 can vary depending on the advanced node, e.g., about 2 nm to about 10 nm.

A dummy gate material (e.g., sacrificial gate material) 16 is formed over the dielectric layer 14, intersecting the adjacent fin 12. In embodiments, the dummy gate material 16 is abutting the dielectric layer 14 adjacent to the fin 12, and can be formed from any dummy gate material such as polysilicon; although other materials are also contemplated by the present invention. The dummy gate material 16 is preferably selective to etching processes of other materials. In embodiments, the dummy gate material 16 can be formed by conventional deposition methods as described herein. In embodiments, the dielectric layer can be selectively thinned or removed from some devices prior to dummy gate formation, which is represented by reference numeral 14.

Figure 2:
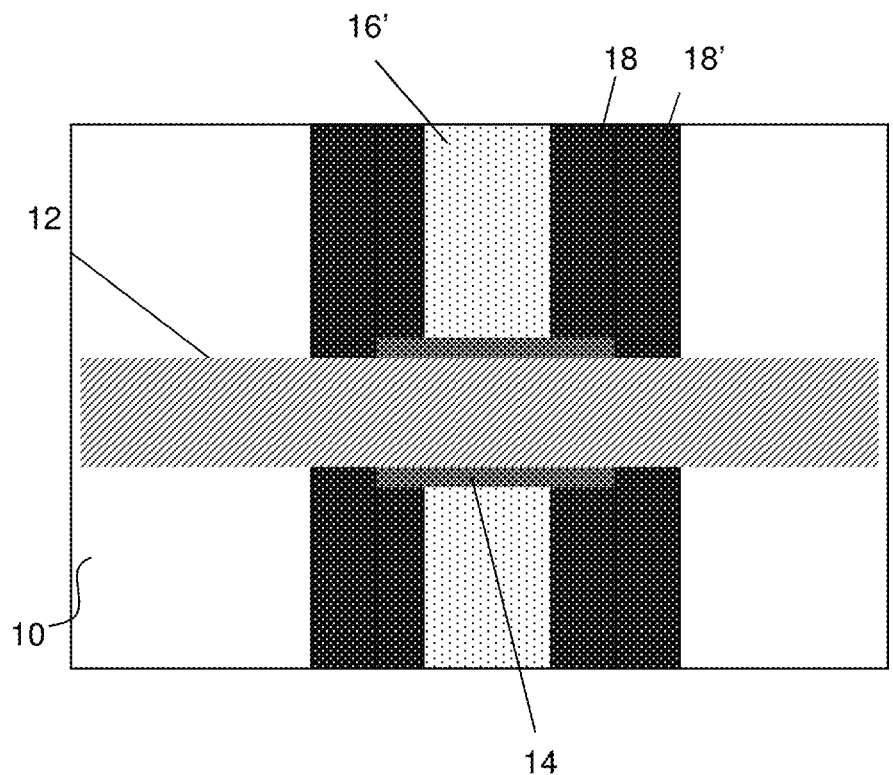
FIGS. 2-4 show additional processing steps and respective structures in accordance with aspects of the present invention.

In FIG. 2, the dummy gate material 16 is patterned to form a dummy gate structure 16'. In embodiments, the dummy gate material can be patterned using conventional lithography and etching processes, e.g., RIE, as described herein. After patterning of the dummy gate structure 16', a spacer 18 can be formed adjacent to the dummy gate structure 16'. The spacer 18 can be formed using conventional deposition methods. In embodiments, the spacer material is SiN or other dielectric material that is selective to the dielectric layer 14.

As further shown in FIG. 2, in embodiments, the dielectric layer 14 can be patterned (removed), e.g., to a length of about 25 nm to 30 nm at the 22 nm node; although other dimensions are also contemplated by the present invention, depending on the node or other design specifications. The patterning of the dielectric layer 14 will effectively form the final dimensions of the gate length in the channel region of the device. In selective devices, though, the dielectric layer 14 can remain on the devices, which would result in a thicker gate dielectric layer and hence lower gate leakage.

A spacer 18' is formed adjacent to the spacer 18 and abutting against the fin 12. In embodiments, the spacer material is formed using conventional deposition methods and is preferably SiN or other dielectric material that is selective to the dielectric layer 14. In an illustrative, non-limiting example, the spacer 18 is formed prior to the patterning of the dielectric layer 14; whereas, the spacer 18' is formed after the patterning of the dielectric layer 14. In this way, the spacer 18 will abut against the dielectric layer 14; whereas, the spacer 18' will abut against the fin 12. This configuration, though, may vary depending on the specific patterning of the dielectric layer 14 as further described herein.

In embodiments, the spacers 18, 18' can be about 5 nm in width, depending on the design specifications. In further embodiments, the spacers 18 and 18' may be formed as a single spacer (with a dimension of about or equal to spacer 18 and spacer 18') as described herein.

Figure 3:
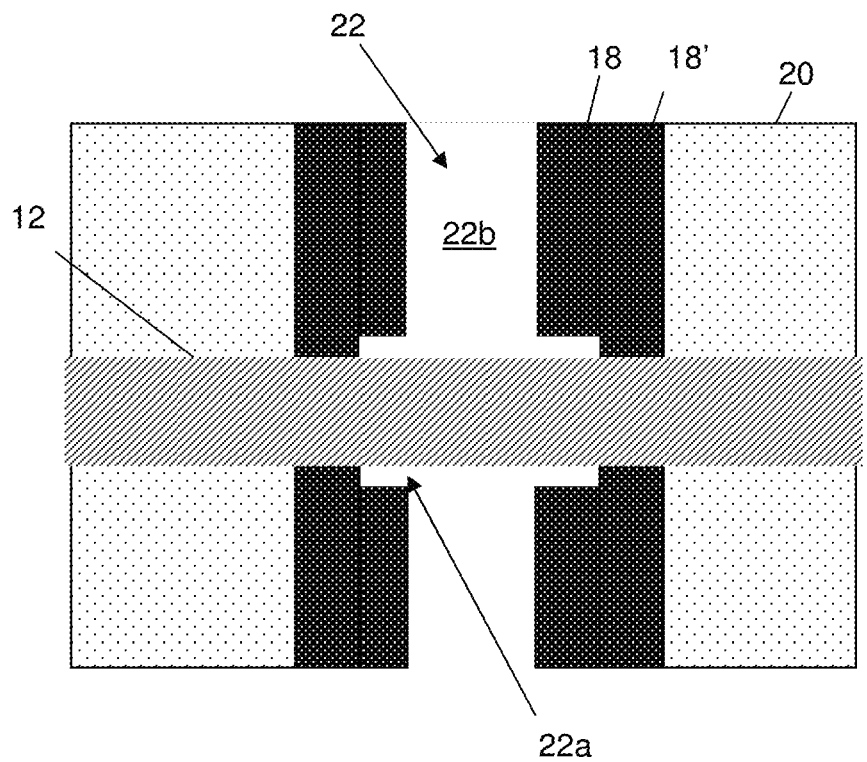

In FIG. 3, a dielectric material 20 is blanket deposited over the structure, e.g., exposed substrate material 10, spacers 18, 18', dummy gate structure 16' and dielectric layer 14. The dielectric material 20 can then be polished to expose the underlying dummy gate structure 16' and the dielectric layer 14 (shown in FIG. 2). By such process, the dielectric material 20 is provided over the substrate abutting the second spacer on both a first and second side of the dummy gate structure 16'. The polishing can be performed using conventional chemical mechanical polishing (CMP) processes. The dummy gate structure 16' and the dielectric layer 14 are then removed to form an opening 22 of different lengths, e.g., openings 22a and 22b. In embodiments, dielectric layer 14 can also be recessed or thinned as should be understood by those of skill in the art (as represented by reference numeral 14 in FIG. 2).

Still referring to FIG. 3, in embodiments, the opening 22a is formed within the channel region of the device and can have a dimension of about 25 nm to 30 nm at the 22 nm mode; although other dimensions are also contemplated by the present invention as described herein. The opening 22b, on the other hand, can be about 10% to 30% smaller (in length) than the opening 22a; although other dimensions are contemplated by the present invention depending on the dimensions of the spacers. The differences in the length of the openings 22a, 22b will affect the capacitance of the gate structure formed therein.

Figure 4:
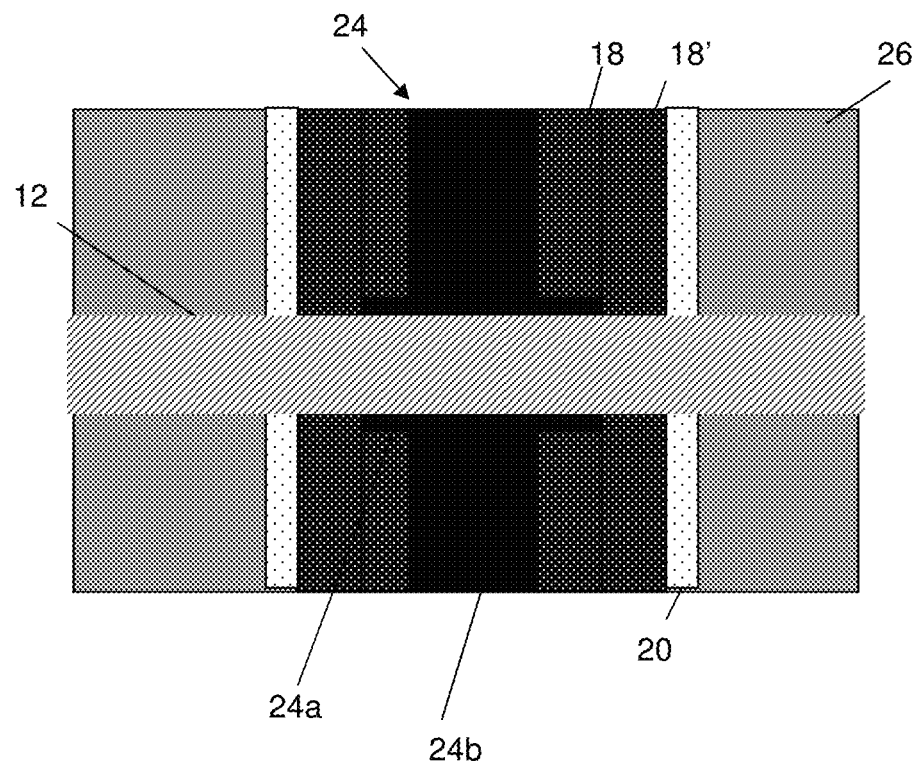

FIG. 4 shows formation of the replacement gate structure 24 with source and drain contacts 26. In embodiments, the replacement gate structure 24 can be deposited within the openings 22a and 22b (shown in FIG. 3) to form a gate of different lengths, e.g., gate regions 24a and 24b. In embodiments, the gate region 24a is provided in the channel region of the device and is larger (in length) than the gate region 24b. The larger length of gate region 24a results in a lower gate capacitance than in the gate region 24b. This is due to the fact that the gate material in the gate region 24a will be closer to the source and drain contacts 26 than gate material in the gate region 24b.

In embodiments, the replacement gate structure 24 can include a stack of materials including a high-k dielectric material (e.g., HfO$_2$), workfunction metals which are designed to change device threshold (e.g., AlCO) and a low resistance metal (e.g., tungsten). Source and drain regions can be formed in conventional processes, adjacent to the fin structure 12, prior to or after the formation of the replacement gate structure 24 (depending on the engineered specifications). The source and drain contacts 26 can be formed using conventional processes including, for example, deposition of epitaxial material, silicide processes and contact metallization formation into a dual damascene opening. As thus shown, the gate material in the gate region 24a (e.g., channel region of the device) is formed closer to the source and drain contacts 26, thereby effectively lowering the resistance of the gate in the channel region.

Figure 5:
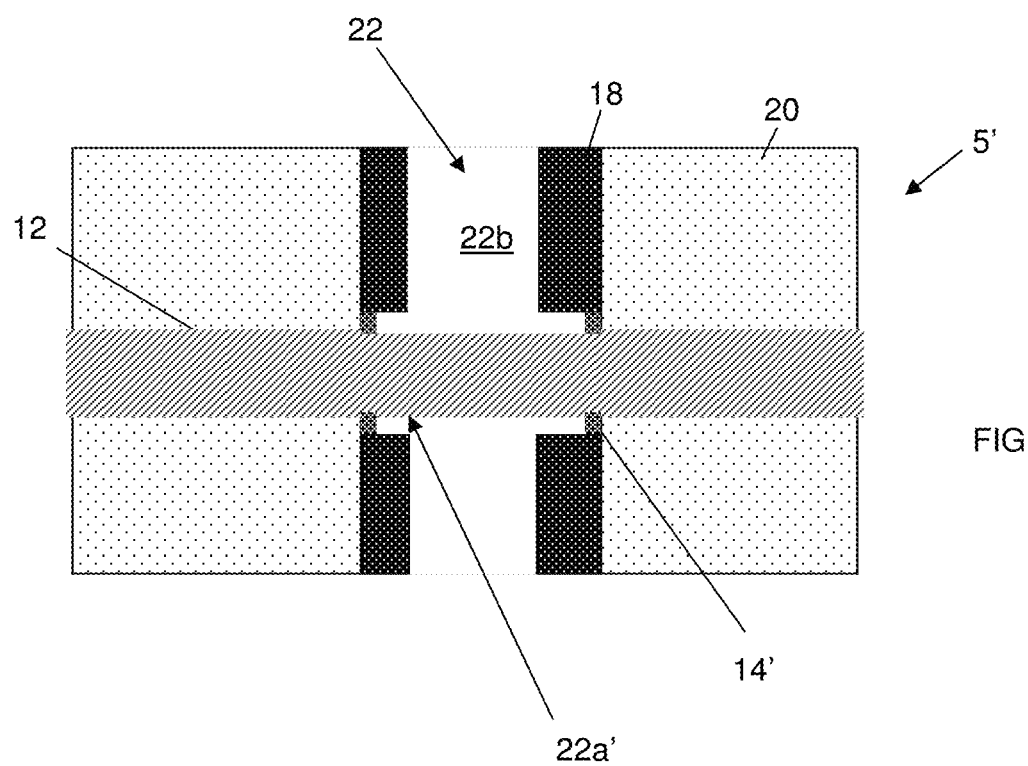
FIGS. 5 and 6 show processing steps and respective structures in accordance with additional aspects of the present invention.
Figure 6:
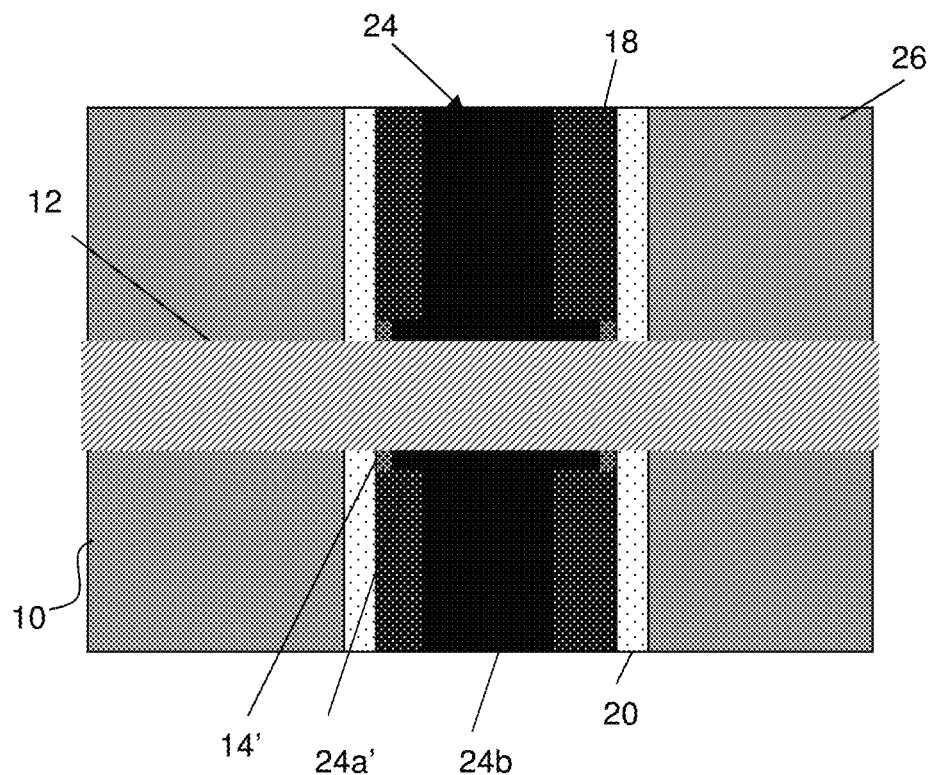

FIGS. 5 and 6 show processing steps and respective structures in accordance with additional aspects of the present invention. Specifically, FIG. 5 shows structure 5' with a single spacer 18, in addition to the formation of dielectric tabs 14' in the channel region 22a'. This embodiment also contemplates using two spacers, which can be represented at reference numeral 18. In embodiments, the dielectric tabs 14' can be formed by partially removing dielectric layer 14 (as described, e.g., in FIG. 3) in the channel region 22a'. In embodiments, the dielectric tabs 14' can be formed of different dimensions in order to adjust the final length of the gate region 24a' as shown in FIG. 6 and, hence, effectively tune the capacitance value of the gate structure. In this way, it is possible to tune the capacitance of the device by adjusting the dimensions of the dielectric tabs 14'.

Figure 7:
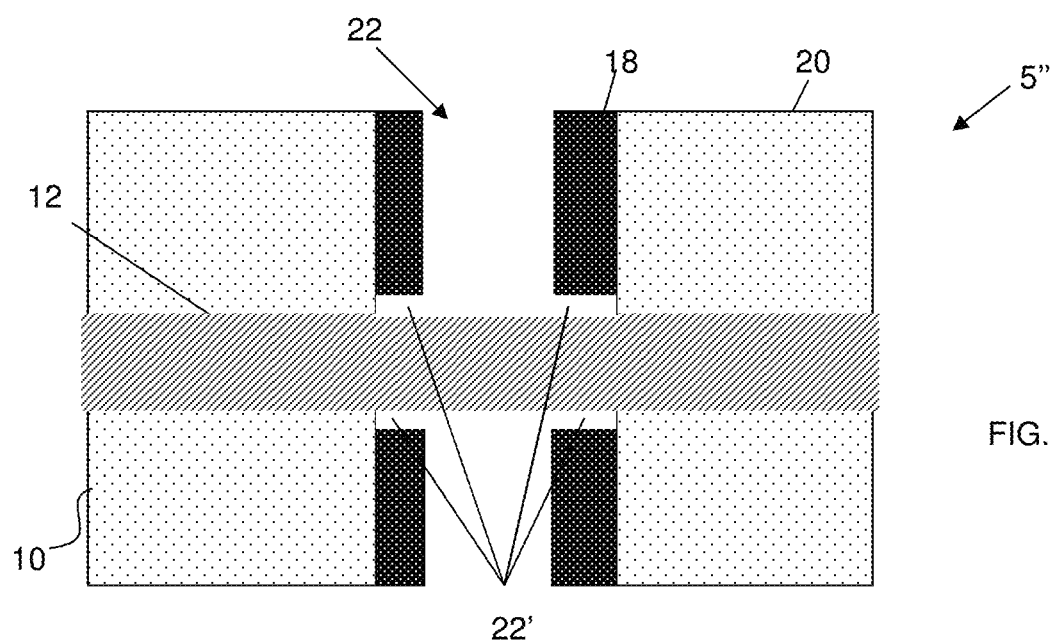
FIGS. 7 and 8 show processing steps and respective structures in accordance with yet additional aspects of the present invention.
Figure 8:
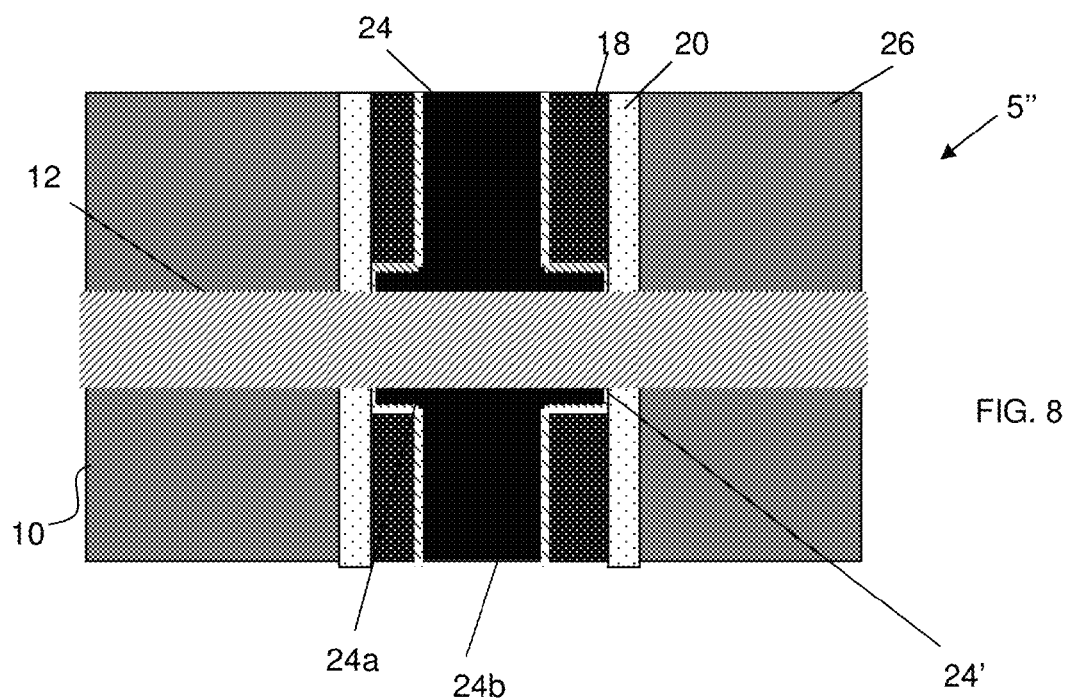

FIGS. 7 and 8 show processing steps and respective structures in accordance with yet additional aspects of the present invention. Specifically, in this embodiment, a structure 5" includes a single spacer 18, with the removal or thinning of the dielectric layer 14 in channel region 22a' (as described, e.g., in FIG. 3). In this way, there is no spacer material or dielectric tab provided between the gate region 24a and source and drain contacts 26. That is, a space 28 is formed between the spacer 18 and fin structure 12. In embodiments, a high-k dielectric material 24' of the gate structure formed in the gate region 24a (e.g., channel regions 22' of FIG. 7) will provide the required separation between the gate region 24a and the source and drain contacts 26 (see, e.g., FIG. 8). In this way, it is possible to tune the capacitance of the device by adjusting the dimensions of the high-k dielectric material 24'. In additional embodiments, the dielectric layer 14 can remain on devices in order to increase the thickness of the dielectric material and, hence, lower gate leakage.

Figure 9:
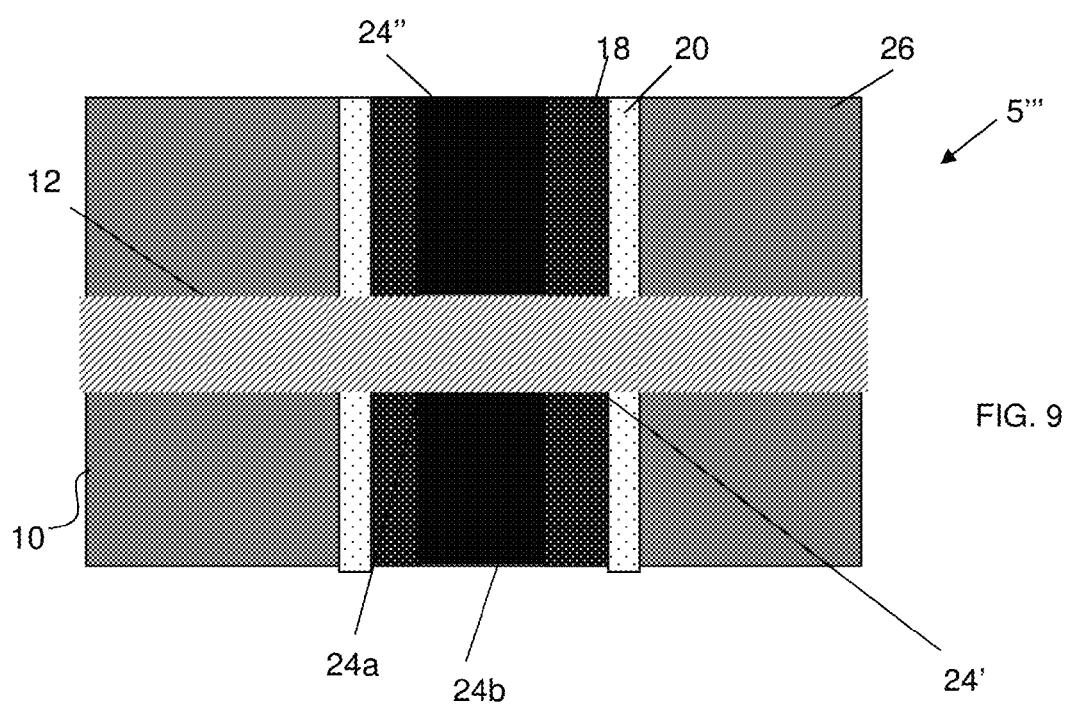
FIG. 9 shows a device with a uniform gate length and respective processing steps in accordance with aspects of the present invention.

FIG. 9 shows a device 5' with a uniform gate length 24". The device 5''' can be formed in any conventional manner, and can be combined with any combination of structures 5, 5' and 5" described herein on a single chip. Accordingly, it should be understood by those of skill in the art that any combination of structures 5, 5', 5" and 5''' can be combined on a single chip to form a variety of different devices. It should also be understood by those of skill in the art that any of the embodiments can be implemented in a planar structure. In addition, in further embodiments and combinations thereof, the dielectric material (dielectric layer 14) can remain on some devices within the channel region in order to provide lower gate leakage. The dielectric material (dielectric layer 14) can also be selectively thinned from some devices prior to dummy gate formation.

Figure 10:
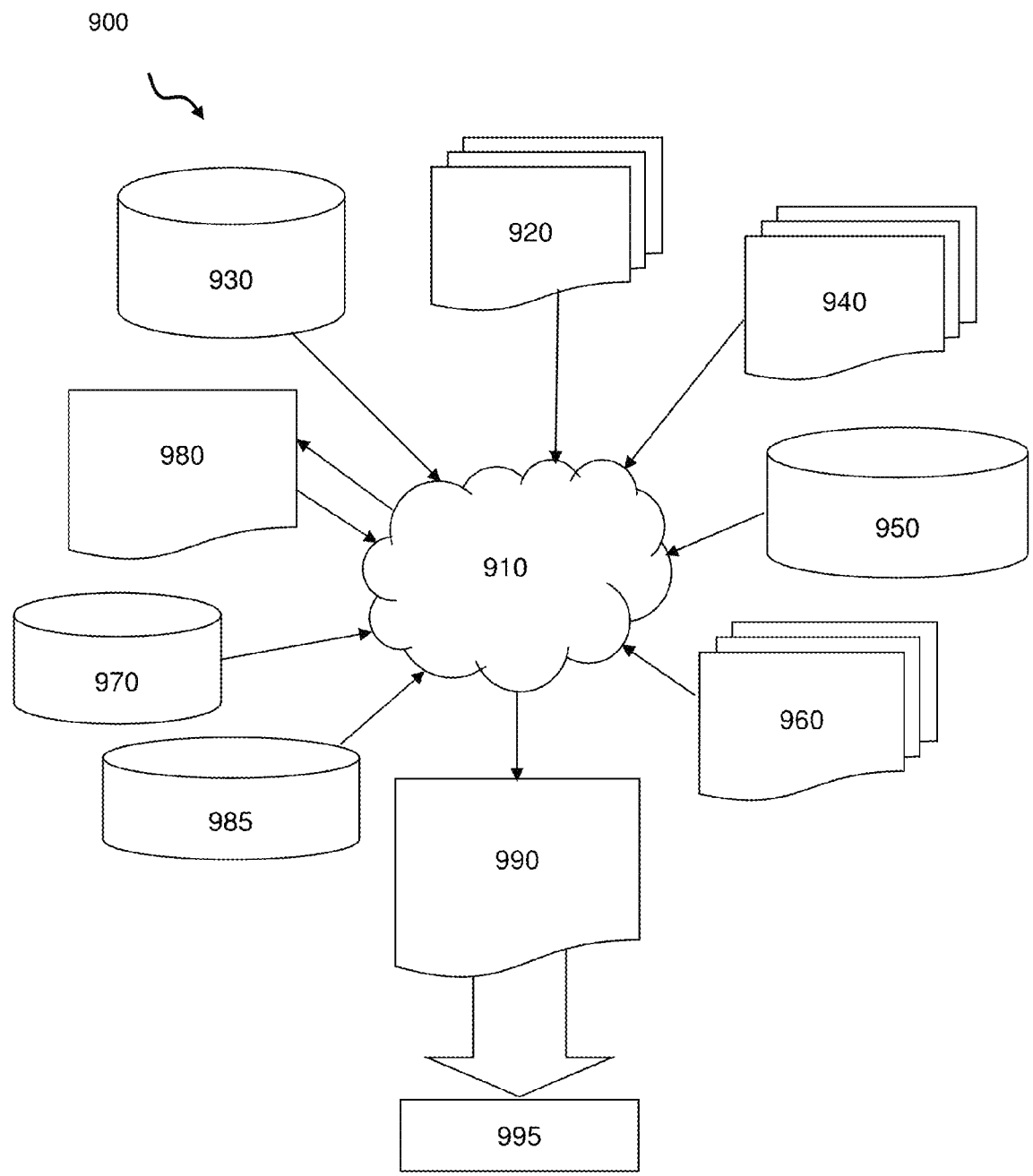
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) device such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a layer of material on a substrate;
   forming a dummy gate structure on the substrate which abuts the layer of material;
   forming at least one spacer adjacent to the dummy gate structure and the layer of material;
   removing the dummy gate structure and at least a portion of the layer of material to form an opening with a varying length; and
   forming a replacement gate structure with varying length by depositing gate material in the opening with the varying length, wherein:
   the layer of material is a dielectric material formed on a sidewall of a fin structure;
   the dielectric material is composed of material different than the at least one spacer; and
   the dielectric material is selectively removed with respect to the at least one spacer to form a longer opening adjacent to the fin structure in a channel region than in other regions of the replacement gate structure.

2. The method of claim 1, wherein:
   the at least one spacer is two spacers;
   a first spacer of the two spacers is formed prior to a patterning of the dielectric material;
   a second spacer of the two spacers is formed after the patterning of the dielectric material; and
   the dielectric material and dummy gate material are removed after forming of the second spacer in order to form the opening with the varying length.

3. The method of claim 2, wherein:
   the opening with the varying gate length has a first length defined by a portion of the second spacer which is larger in length than a second length defined by portions of the first spacer; and
   the replacement gate structure has a greater length in areas corresponding to the first length than the second length.

4. The method of claim 3, wherein the replacement gate structure formed in the area corresponding to the first length is closer to source and drain contacts than remaining portions of the replacement gate structure.

5. The method of claim 4, wherein the replacement gate structure is formed separated from the source and drain contacts, in the channel region, by the second spacer.

6. The method of claim 1, further comprising depositing high-k dielectric material within a channel region, wherein the high-k dielectric material forms a portion of the replacement gate structure and separates metal material of the replacement gate structure from source and drain contacts.

7. The method of claim 1, wherein the layer of material is a dielectric layer which is removed from a sidewall of a fin structure and the replacement gate structure is separated from source and drain contacts, in a channel region, by dielectric material of the replacement gate structure.

8. The method of claim 1, further comprising forming a second replacement gate structure with a uniform length on a same chip as the replacement gate structure.

9. The method of claim 1, wherein the layer of material is thinned prior to forming of the dummy gate structure.

10. The method of claim 1, wherein the varying length of the replacement gate structure has a first length in a channel region about 10% to 30% larger than a second length in other portions of the replacement gate structure.

11. A method, comprising:
    forming a layer of material on a substrate;
    forming a dummy gate structure on the substrate which abuts the layer of material;
    forming at least one spacer adjacent to the dummy gate structure and the layer of material;
    removing the dummy gate structure and at least a portion of the layer of material to form an opening with a varying length;
    forming a replacement gate structure with varying length by depositing gate material in the opening with the varying length, wherein:
    the layer of material is dielectric material which is partially removed to form tabs; and
    the tabs provide a separation between the replacement gate structure and source and drain contacts.

12. A method, comprising:
    forming a layer of material on a substrate;
    forming a dummy gate structure on the substrate which abuts the layer of material;
    forming at least one spacer adjacent to the dummy gate structure and the layer of material;
    removing the dummy gate structure and at least a portion of the layer of material to form an opening with a varying length; and
    forming a replacement gate structure with varying length by depositing gate material in the opening with the varying length, wherein the layer of material is recessed or thinned.

13. A method, comprising:
    forming a fin structure on a substrate;
    forming a dielectric material on the substrate and abutting the fin structure;
    forming a dummy gate structure abutting the dielectric material;
    forming at least one spacer adjacent to the dummy gate structure;
    removing the at least one dummy gate structure and at least a portion of the dielectric material in order to form an opening with a first length above a channel region and a second length adjacent to the first length;
    forming a replacement gate structure in the opening such that the replacement gate structure has a first dimension corresponding to the first length and a second dimension corresponding to the second length; and
    forming source and drain contacts adjacent to the at least one spacer,
    wherein the first dimension of the replacement gate structure has a lower capacitance than the second dimension of the replacement gate structure, and
    wherein the removing of the dielectric material forms tabs between the source and drain contacts and the replacement gate structure.

14. The method of claim 13, wherein the second spacer of the at least one spacer separates the replacement gate structure from the source and drain contacts.

15. The method of claim 13, wherein the removing of the dielectric material lengthens the first length.

16. The method of claim 15, wherein a high-k dielectric material of the replacement gate structure provides a separation between the source and drain contacts and metal material of the replacement gate structure.

17. The method of claim 13, wherein the first dimension is in a channel region and has a length about 10% to 30% larger than a length of the second dimension.

18. A structure, comprising:
   a fin structure on a substrate;
   a replacement gate structure adjacent to the fin structure which has a first length defined by a first spacer and a second length in a channel region of a device defined by a second spacer, the first length being shorter than then second length; and
   source and drain contacts adjacent to the second spacer.

* * * * *